United States Patent [19]

Wang et al.

[11] Patent Number: 4,797,858
[45] Date of Patent: Jan. 10, 1989

[54] SEMICONDUCTOR MEMORY WITH DIVIDED WORD LINES AND SHARED SENSE AMPLIFIERS

[75] Inventors: Karl L. Wang; Lal C. Sood, both of Austin, Tex.

[73] Assignee: Motorola, Inc., Schaumburg, Ill.

[21] Appl. No.: 31,305

[22] Filed: Mar. 30, 1987

[51] Int. Cl.⁴ ............................................. G11C 7/00
[52] U.S. Cl. ..................................................... 365/230
[58] Field of Search .............................. 365/189, 230

[56] References Cited

U.S. PATENT DOCUMENTS

| | | | |
|---|---|---|---|
| 4,482,984 | 11/1984 | Oritani | 365/154 |
| 4,520,465 | 5/1985 | Sood | 365/203 |
| 4,596,000 | 6/1986 | Wiedmann | 365/174 |
| 4,596,001 | 6/1986 | Baba | 365/189 |
| 4,596,003 | 6/1986 | Shimizu | 365/189 |
| 4,615,021 | 9/1986 | Yoshida et al. | 365/189 |
| 4,675,845 | 6/1987 | Itoh et al. | 365/189 |
| 4,692,901 | 9/1987 | Kumanoya et al. | 365/189 |
| 4,723,228 | 2/1988 | Shah et al. | 365/230 |

Primary Examiner—James W. Moffitt
Attorney, Agent, or Firm—Jonathan P. Meyer

[57] ABSTRACT

A semiconductor memory device having a divided word line architecture in which each block of the memory array is divided into half-blocks and the half-blocks of each block are located on different halves of the device separated by the row decoder. A data line bussing scheme cooperates with this unique organization of the memory array to provide for sense amplifier sharing. This feature allows fewer, and larger sense amplifiers for better performance.

6 Claims, 4 Drawing Sheets

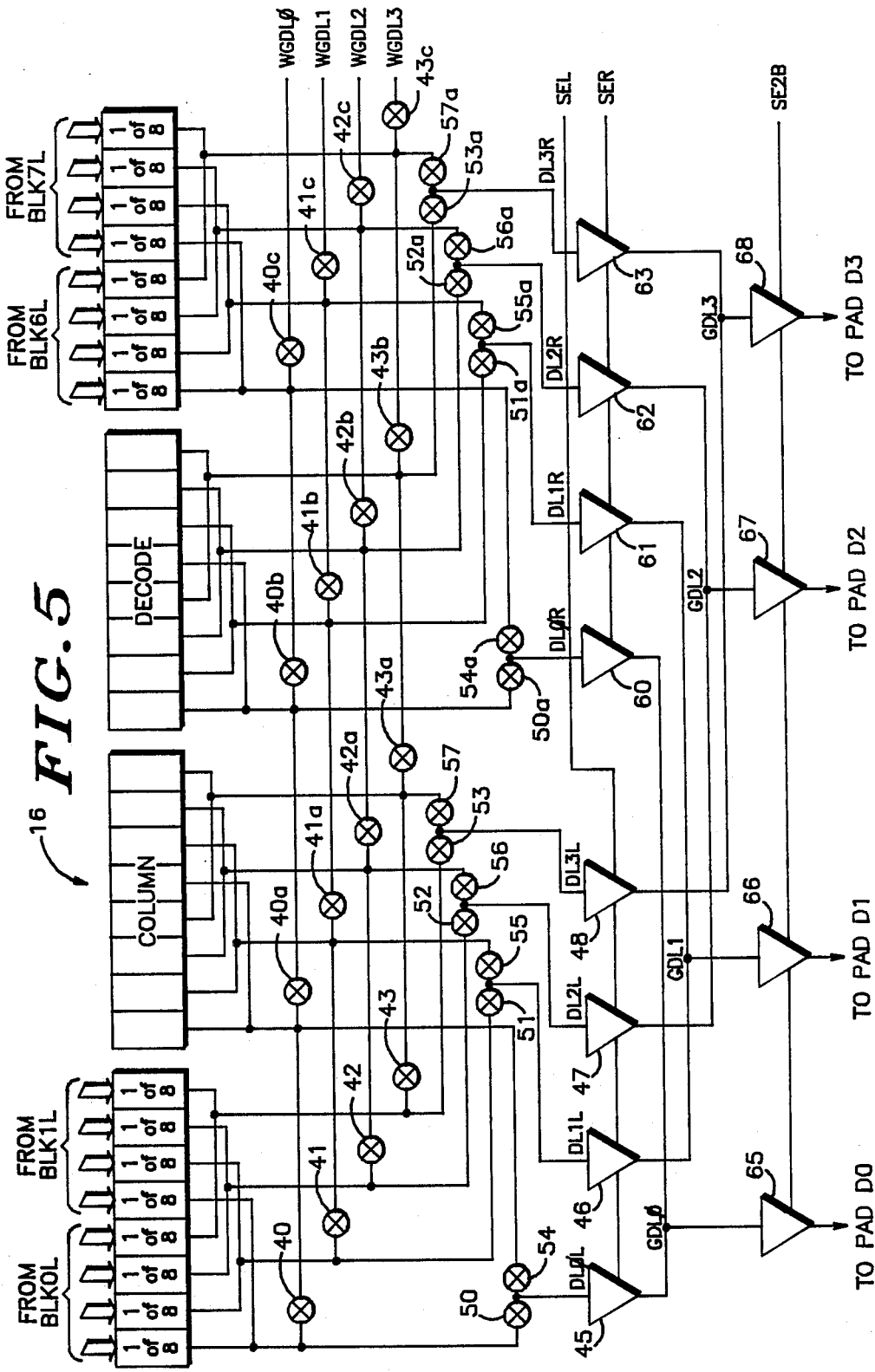

SEMICONDUCTOR MEMORY WITH DIVIDED WORD LINES AND SHARED SENSE AMPLIFIERS

FIELD OF THE INVENTION

The present invention relates, in general, to semiconductor memory devices. More particularly, the invention relates to an architecture which may be particularly suited to high density static random access memories (SRAMs) and which utilizes divided word line techniques to minimize the word line RC product and also utilizes shared first stage sense amplifiers and data line bussing for optimal performance.

BACKGROUND OF THE INVENTION

Semiconductor memories in general, and SRAMs in particular, present the constant challenge of increasing density while maintaining manufacturability and increasing access speed. Many architectural, circuit and process innovations have been introduced to satisfy one or more of these goals.

In divided word line architectures, the memory array is subdivided into blocks. Each block contains all of the rows of the array, but only some of the columns thereof. Low resistivity global word lines, typically metal, span the entire array in the row direction. A row decoder selects a particular one of the global word lines in response to an address. In addition, a block decoder provides block select signals in response to the address, indicating which one or more of the blocks is to be accessed. The selected global word line interacts with the block select signals to select one or more local word lines. The local word lines are typically comprised of a higher resistivity material such as polysilicon. The divided word line technique generally allows the length of the local word lines to be minimized, thus minimizing the word line RC product and providing faster access times.

However, as the density of memories utilizing a divided word line architecture increases, some aspects of their design become troublesome. For instance, one example of a 256K SRAM organized as a 32K-by-8 array (referred to as byte-wide), divides the array into 16 blocks. Each block comprises 512 rows and 32 columns. Each block is provided with eight first stage, or local, sense amplifiers. Because of the large number of sense amplifiers, their size is necessarily small, thus preventing the designer from optimizing the sense amplifier design.

Other problems which become apparent primarily in byte-wide, divided word line memories include increased data line length, both in the local data lines (prior to the first stage sense amplifiers) and the global data lines (between the first and second stage sense amplifiers).

SUMMARY OF THE INVENTION

Accordingly, it is an object of the present invention to provide an improved semiconductor memory device utilizing a divided word line architecture.

A further object of the present invention is to provide an improved semiconductor memory device utilizing a divided word line architecture and providing improved sense amplifier performance by means of sense amplifier sharing.

Yet a further object of the present invention is to provide an improved semiconductor memory device utilizing a divided word line architecture and providing improved data line performance through a data line bussing scheme.

These and other objects and advantages of the present invention are provided by a semiconductor memory device comprising a plurality of memory cells organized into an array of N rows and M columns, said rows and columns being further organized into K blocks, each comprising N rows and M/K columns, each said block being further organized into two half-blocks, each comprising N rows and M/2K columns; P metal word lines extending across said array in the row direction; row decoder means for receiving a portion of an address and for selecting one of said P metal word lines in response thereto, a first half of said blocks lying on a first side of said row decoder means and a second half thereof lying on a second side thereof; block decoder means for receiving a portion of said address and for selecting two of said half-blocks in response thereto, one of said selected half-blocks lying on said first side of said row decoder and the other selected half-block lying on the other side thereof; local word line selector means for receiving signals from said metal word lines and from said block decoder means and for selecting one local word line for each of said two selected half-blocks; M pairs of bit lines extending across said array in the column direction; column decoder means coupled to said M pairs of bit lines for receiving a portion of said address and for selecting L pairs of said bit lines from each said half-block in response thereto; and sense amplifier means for responding to signals carried on said L pairs of bit lines from each of said selected half-blocks and for providing a plurality of data bits corresponding to said signals at outputs of said memory device.

These and other objects and advantages of the present invention will be apparent from the detailed description below, taken together with the drawings.

BRIEF DESCRIPTION OF THE DRAWINGS

FIG. 5 is a detailed diagram illustrating the data line bussing scheme and sense amplifier sharing scheme for one half of the semiconductor memory device of FIG. 1.

DETAILED DESCRIPTION OF THE INVENTION

Figure 1:
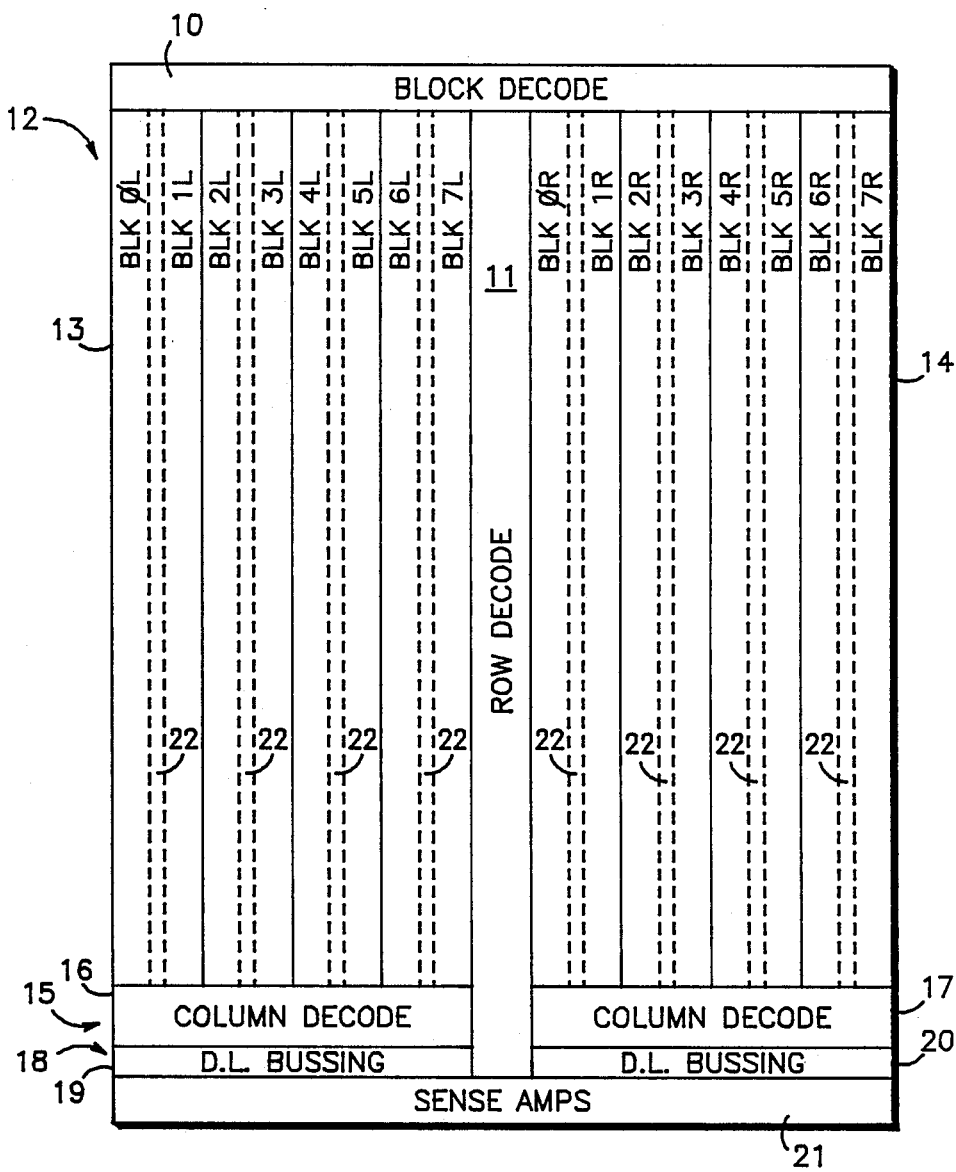
FIG. 1 is a block diagram illustrating the major functional features of a semiconductor memory device according to the principles of the present invention and the approximate layout thereof.

FIG. 1 illustrates the approximate layout of the major functional features of a semiconductor memory device according to the principles of the present invention. This description is based on the design of a 256K SRAM organized in byte-wide fashion; that is, 32K-by-8. Of course, the principles of the present invention may be applied by those skilled in the art to memory devices of different organization, different size and, indeed, different type, such as a DRAM, perhaps.

Features which are common to semiconductor memory devices, such as pads for interconnection to the pins of the completed device, various timing and precharging circuits, data buffers and the like are not illustrated in FIG. 1 for purposes of brevity.

A semiconductor memory device is comprised of an array of individual memory cells, each capable of storing a single digital bit of data, organized into N rows and M columns. The product of N and M is equal to the number of cells in the array. The particular device described above comprises 512 rows and 512 columns, thus 512 times 512 is 262,144, which is commonly referred to as 256K. The design of a memory cell suitable for use in such a memory is well known and will not be described in detail herein.

The memory device illustrated in FIG. 1 comprises a block decode apparatus 10, a row decode apparatus 11, a memory array 12 which further comprises a left-half array 13 and a right-half array 14, a column decode apparatus 15 which further comprises a left-half column decode 16 and a right-half column decode 17, a data line bussing apparatus 18 which further comprises a left-half data line bussing apparatus 19 and a right-half data line bussing apparatus 20 and a sense amplifier apparatus 21.

Array 12 is further divided into K blocks, each comprising N rows and M/K columns. In this case, each block comprises 512 rows and 64 columns of memory cells. Each block is further divided into two half-blocks, each comprising N rows and M/2K columns (512-by-32). Of each block, one half-block is located in left-half array 13 and the other half-block is located in right-half array 14. Left-half array 13 comprises eight half-blocks labelled 0L–7L, respectively. Similarly, right-half array 14 comprises eight half-blocks labelled 0R–7R, respectively. As will be more clear from the further description below, half-blocks 0L and 0R combine to form a block 0 of array 12.

In general, different portions of an address are supplied to block decode apparatus 10, row decode apparatus 11 and column decode apparatus 15 to access the memory. Block decode apparatus 10 makes a 1-of-K selection in response to the address bits supplied to it. Row decode apparatus 11 makes a 1-of-P selection based on its portion of the address. As will be more apparent from the description below, column decode apparatus 15 need not make a 1-of-M selection. In the particular embodiment being described, the column select involves a plurality of 1-of-8 selections.

The 1-of-P selection of row decode apparatus 11 is used to select one of P global word lines (see FIG. 2) which cross the entire width of the device in the row direction. As is familiar, the global word lines are typically formed of a low resistivity material such as metal. In the particular embodiment being described, P is equal to N/2, or 256. In general, P may be equal to N or be some fraction thereof. The choice to employ fewer global word lines than the number of rows in the device is made in order to lessen the load on block decode apparatus 10. A plurality of local word line drivers 22 are located between pairs of adjacent half-blocks (e.g., between half-block 0L and half-block 1L). Signals from the global word lines and from block decode apparatus 10 are combined in local word line drivers 22 to select the appropriate local word lines. For each address, two local word lines are selected, one which spans a half-block in left-half array 13 and one which spans the corresponding half-block in right-half array 14 (e.g., half-block 0L and half-block 0R).

Figure 2:
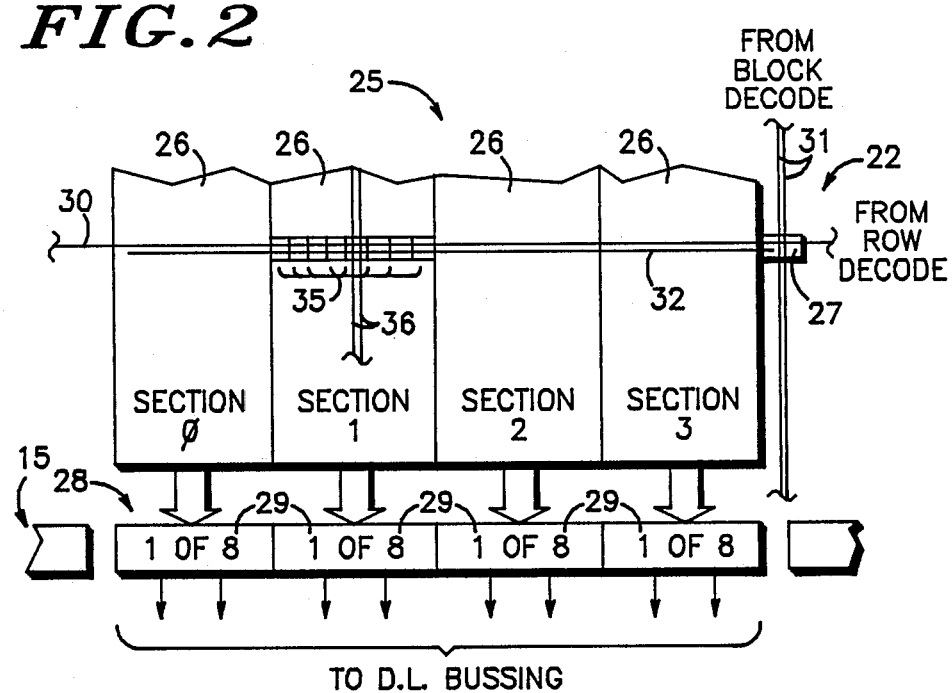
FIG. 2 is a detailed block diagram of a portion of the semiconductor memory device of FIG. 1.

FIG. 2 illustrates the detailed structure of a half-block 25, a portion 27 of a local word line driver 22 and a portion 28 of column decode apparatus 15. Each half-block 25 comprises L sections 26. In the particular embodiment, there are four sections 0–3. Thus, each section comprises N rows and M/2KL columns (512-by-8). The portion 28 of column decode apparatus 15 which serves half-block 25 comprises L 1-of-M/2KL (in this case, 1-of-8) selection circuits 29, one serving each section 26. Thus, since each section 26 comprises M/2KL columns, each circuit 29 selects exactly one column from the associated section 26.

A global word line 30 crosses half-block 25 and local word line driver 22. Portion 27 of local word line driver 22 underlies global word line 30 and is connected thereto. In addition, portion 27 underlies and is connected to a signal line 31 which arises in block decode apparatus 10 and runs down the length of local word line driver 22. In the particular embodiment, line 31 comprises two physical conductors. This is necessary because of the choice of P equal N/2. In other words, there are insufficient global word lines to uniquely select a local word line. In fact, one of the row address bits is input to block decode apparatus 10. So, in addition to a 1-of-K selection for block select, block decode apparatus 10 provides a 1-of-2 selection to double the number of row selections from 256 to 512. Of course, this is purely an implementational choice of the designers of this particular memory device and does limit the scope of the present invention.

Portion 27 comprises a fairly simple circuit which simply responds to the signals on global word line 30 and on line 31 and, if indicated, selects local word line 32. Local word line 32 runs parallel to global word line 30 across the width of half-block 25. Local word line 32 would typically be fabricated of polysilicon or a similar material which is of higher resistivity than the metal of which global word line 30 is fabricated. Since local word line 32 is only as wide as one half-block, however, and since only one local word line is selected in each half-block, the resulting contribution to the word line RC product, which is a factor in access speed, is minimized. The particular organization described here allows local word lines to be only as long as 32 cells are wide.

As is described above, the portion of each row which lies within a particular section 26 is M/2KL cells wide. That is, when local word line 32 is selected, M/2KL cells 35 within each section 26 are selected. Each selected cell is coupled to a bit line pair 36 which runs the entire length of array 12 and is selectably connectable to each cell in that row of the array. Thus, when any local word line is selected in the particular embodiment being described, eight bits of data will be output from each section on eight bit line pairs, to be further reduced to one bit line pair per section by block decode apparatus 15.

Each circuit 29 of column decode apparatus 15 selects one of the bit line pairs from each section in response to the address bits supplied to it. Thus, the output of portion 28 comprises 4 bit line pairs. Since two local word lines are selected for every address supplied to the device, one from each half of the array, a total of eight bits are output.

Figure 3:
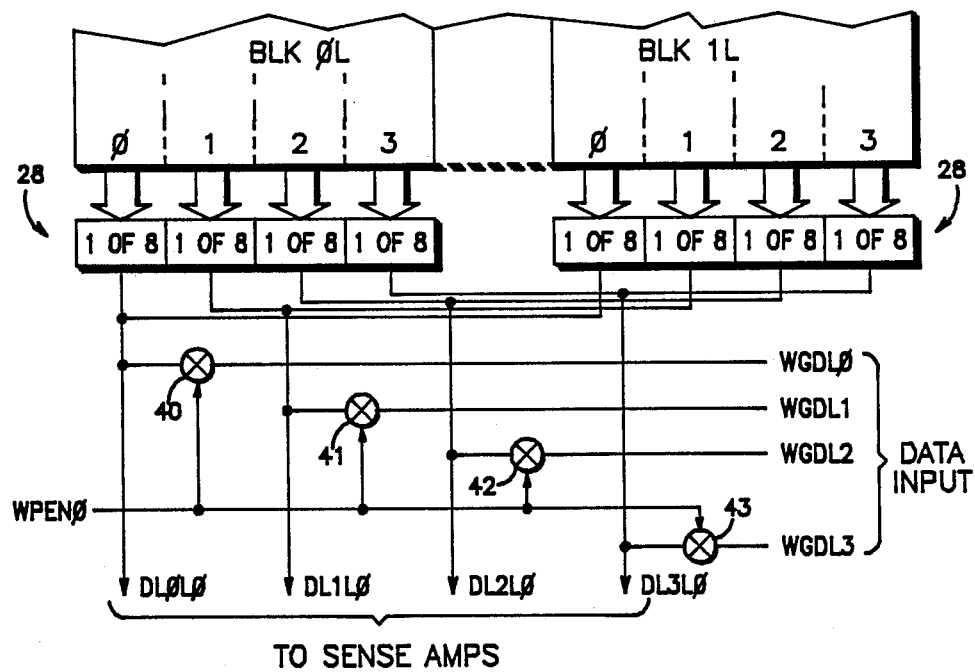
FIG. 3 is a detailed diagram illustrating a portion of the data line bussing scheme of the semiconductor memory device of FIG. 1.

FIG. 3 illustrates a portion of the data line bussing scheme of the semiconductor memory device being described. The portion illustrated involves the initial data line bussing for half-blocks 0L and 1L. As described with reference to FIG. 2, each half-block has a portion 28 of column decode apparatus 15 associated therewith. Each portion 28 comprises one 1-of-8 selection circuit for each of the four sections of the half-block. A dataline DL0L0 is connected to the selection circuits which serve section 0 of half-block 0L and section 0 of half-block 1L. Similarly, a data line DL1L0 is connected to the selection circuits which serve section 1 of half-block 0L and section 1 of half-block 1L. A data line DL2L0 is connected to the selection circuits which serve section 2 of half-block 0L and section 2 of half-block 1L. A data line DL3L0 is connected to the selection circuits which serve section 3 of half-block 0L and section 3 of half-block 1L. As will be apparent to those skilled in the art, each of the data lines described is, in fact, a data line pair. This is true of each of the data lines discussed hereinafter, but will not be mentioned further for reasons of brevity.

Since each data line DL0L0–DL3L0 serves two adjacent half-blocks, and since adjacent half-blocks are never portions of the same block in this architecture, there need be no gating mechanism other than the column decoder between the data lines and the bit lines. In addition, since each of these data lines spans only two half-blocks and one local word line driver circuit, the data lines are not unnecessarily long.

A write global data line WGDL0 is connected through a gate 40 to data line DL0L0. Similarly, a write global data line WGDL1 is connected through a gate 41 to data line DL1L0. A write global data line WGDL2 is connected through a gate 42 to data line DL2L0. A write global data line WGDL3 is connected through a gate 43 to data line DL3L0. Gates 40-43 are commonly controlled by a control signal WPEN0. This arrangement provides the means by which data being written to the memory device is placed on the appropriate data lines while bypassing the sense amplifiers. Various buffers, drivers, timing circuits and the like are involved in the write mechanism and are well known to those of skill in the art.

Figure 4:
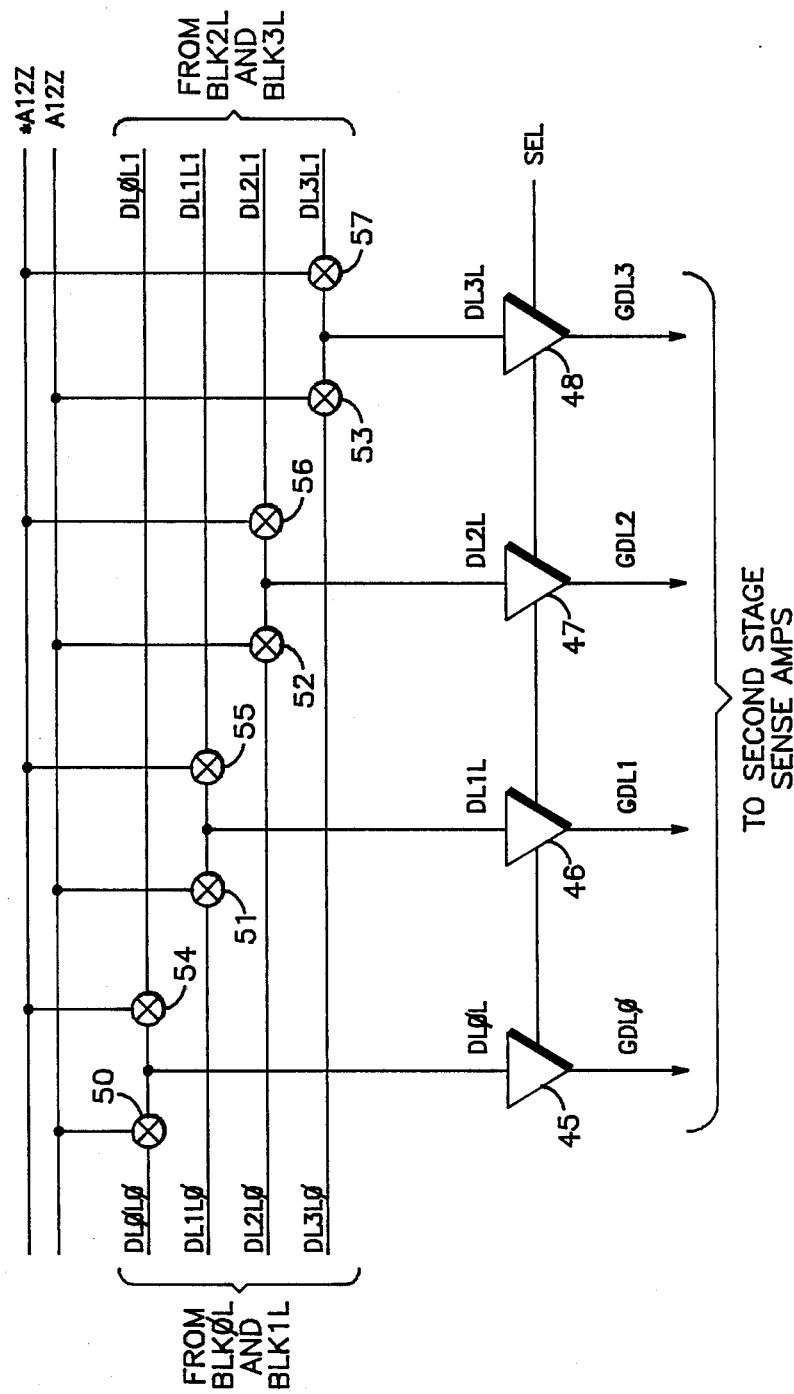
FIG. 4 is a detailed diagram illustrating a portion of the data line bussing and sense amplifier sharing scheme of the semiconductor memory device of FIG. 1.

FIG. 4 illustrates stage of the data line bussing scheme which immediately follows the portion described with reference to FIG. 3. This portion involves the data line bussing for half-blocks 0L, 1L, 2L and 3L and the arrangement by which these four half-blocks share four first stage sense amplifiers 45-48.

The data lines previously discussed, DL0L0–DL3L0, are connected to data lines DL0L–DL3L, respectively, through gates 50, 51, 52 and 53, respectively. Gates 50-53 are commonly controlled by a control signal A12Z. Data lines DL0L1–DL3L1, which are analogous to data lines DL0L0–DL3L0, respectively, and are coupled to half-blocks 2L and 3L, are connected to data lines DL0L–DL3L, respectively, through gates 54, 55, 56 and 57, respectively. Gates 54-57 are commonly controlled by a control signal *A12Z, which is the complement of control signal A12Z.

Data lines DL0L–DL3L are connected to the inputs of sense amplifiers 45-48, respectively. In the case of sense amplifier 45, for instance, since only one of gates 50 and 54 is conducting at any time, only one of data lines DL0L0 and DL0L1 will be connected to sense amplifier 45. Control signals A12Z and *A12Z are derived from the block selection process to determine which set of data lines should be coupled to the first stage sense amplifiers. This arrangement provides that four half-blocks require only four first stage sense amplifiers. This significantly relieves the layout restraints imposed by the large number of first stage sense amplifiers in prior art designs which, in turn, allows each first stage sense amplifier to be larger and better optimized.

First stage sense amplifiers 45-48 are enabled by a commonly control signal SEL, which is derived from the block selection process. The outputs of these sense amplifiers comprise global data lines GDL0–GDL3, respectively.

FIG. 5 illustrates the data line bussing and sense amplifier sharing scheme for the entire left half of the memory device being described. This apparatus is a simple extension of the details described above, so many of the details, control signals and data line labels are omitted for reasons of clarity. In an extension of the arrangement described with reference to FIG. 3, gates 40a, 41a, 42a and 43a control the coupling of write global data lines WGDL0–WGDL3 to the column decode apparatus portion serving half-blocks 2L and 3L. These gates are commonly controlled by a control signal WPEN1. Similarly, a control signal WPEN2 controls gates 40b, 41b, 42b and 43b, which control the coupling of the write global data lines to half-blocks 4L and 5L. A control signal WPEN3 controls gates 40c–43c, which control the coupling of the write global data lines to half-blocks 6L and 7L. Control signals WPEN0–WPEN3 are, of course, derived from the block selection process.

Gates 50a–53a, which are directly analogous to gates 50-53 as described above, are controlled by control signal A12Z. Similarly, gates 54a–57a are controlled by control signal *A12Z. Data lines DL0R–DL3R, which are analogous to data lines DL0L–DL3L as described above, are connected to the inputs of first stage sense amplifiers 60-63, respectively. Sense amplifiers 60-63 are commonly enabled by a control signal SER, which is derived from the block selection process and is analogous to SEL.

The output of sense amplifier 60 is connected to global data line GDL0. The output of sense amplifier 61 is connected to global data line GDL1. The output of sense amplifier 62 is connected to global data line GDL2. The output of sense amplifier 63 is connected to global data line GDL3.

Global data line GDL0 is connected to the input of a second stage sense amplifier 65, whose output is connected to pad D0 (data bit 0) of the memory device. Various output buffers and the like may be connected between sense amplifier 65 and pad D0. As is apparent, the maximum distance any data has been bussed through the various data lines to reach sense amplifier 65 is one-half of the width of the device. In similar fashion, global data lines GDL1–GDL3 are connected to inputs of second stage sense amplifiers 66-68, respectively. Sense amplifiers 66-68 have outputs coupled to pads D1–D3, respectively, of the device.

A semiconductor memory device has been described which utilizes divided word line architecture and is improved over prior art devices of similar design. The divided word line architecture is combined with sense amplifier sharing to provide improved sense amplifier performance through the relief of layout constraints. A data line bussing scheme which allows sense amplifier sharing while incurring minimal penalties of increased data line length and increased number of gates is also disclosed.

While the present invention has been shown and described with reference to a particular embodiment thereof, those skilled in the art will appreciate that various modifications and changes thereto may be made and yet fall within the spirit and scope of the present invention.

We claim:

1. A semiconductor memory device comprising:
   a plurality of memory cells organized into an array of N rows and M columns, said rows and columns being further organized into K blocks, each comprising N rows and M/K columns, each said block being further organized into two half-blocks, each comprising N rows and M/2K columns;
   P metal word lines extending across said array in the row direction;
   row decoder means for receiving a portion of an address and for selecting one of said P metal word lines in response thereto, a first half of said blocks lying on a first side of said row decoder means and a second half of said blocks lying on a second side thereof;
   block decoder means for receiving a portion of said address and for selecting two of said half-blocks in response thereto, one of said selected half-blocks lying on said first side of said row decoder means and the other selected half-block lying on the other side thereof;
   local word line selector means for receiving signals from said metal word lines and from said block decoder means and for selecting one local word line for each of said two selected half-blocks;
   M pairs of bit lines extending across said array in the column direction;
   column decoder means coupled to said M pairs of bit lines for receiving a portion of said address and for selecting L pairs of said bit lines from each said half-block in response thereto; and
   sense amplifier means for responding to signals carried on said L pairs of bit lines from each of said selected half-blocks and for providing a plurality of data bits corresponding to said signals at outputs of said memory device;
   wherein said sense amplifier means further comprises;
   a first plurality of fewer than KL sense amplifiers, each of said first plurality of sense amplifiers being coupled to more than one of said 2KL pairs of bit lines selected by said column decoder means; and
   a second plurality of sense amplifiers equal in numbers to said number of data bits, each of said second plurality of sense amplifiers having an input coupled to outputs of more than one of said first plurality of sense amplifiers and an output coupled to said outputs of said memory device.

2. A semiconductor memory device according to claim 1 further comprising:
   data line bussing means coupled between said column decoder means and said sense amplifier means for receiving 2KL bit line pairs from said column decoder means and for providing a predetermined number of bit line pairs to said sense amplifier means, said predetermined number being equal in number to said first plurality of sense amplifiers and said data line bussing means being responsive to signals from said block decoder means.

3. A semiconductor memory device according to claim 2 wherein:
   each said half-block is further divided into L sections, said column decoder means selecting one bit line pair from each said section.

4. A semiconductor memory device according to claim 3 wherein said half-blocks are arranged in pairs and wherein said data line bussing means further comprises:
   for each said pair of half-blocks, L first data lines, each said first data line being coupled, through said column decoder means, to bit lines from one of said sections of each of said pair of half-blocks; and
   for each said pair of half-blocks, L/2 second data lines, each said second data line being coupled to two of said first data lines.

5. A semiconductor memory device according to claim 4 wherein said sense amplifier means further comprises:
   a first stage sense amplifier connected to each of said second data lines.

6. A semiconductor memory device according to claim 2 wherein:
   the number of said first plurality of sense amplifiers is equal to KL/2 and the number of said second plurality of sense amplifiers is equal to KL/4.

* * * * *